United States Patent [19]
He

[11] Patent Number: 5,898,721
[45] Date of Patent: Apr. 27, 1999

[54] INGAASP/ALGAAS/GAAS HETERO STRUCTURE DIODE LASER CONTAINING INDIUM

[75] Inventor: Xiaoguang He, Tucson, Ariz.

[73] Assignee: Opto Power Corporation, Tucson, Ariz.

[21] Appl. No.: 08/800,768

[22] Filed: Feb. 14, 1997

[51] Int. Cl.[6] .................................................. H01S 3/19
[52] U.S. Cl. ............................................. 372/45; 372/44
[58] Field of Search .................................. 372/45, 44, 46, 372/96; 385/14; 438/38

[56] References Cited

U.S. PATENT DOCUMENTS

| | | | |
|---|---|---|---|
| 5,088,099 | 2/1992 | Chen et al. | 372/45 |
| 5,208,183 | 5/1993 | Chen et al. | 438/32 |
| 5,260,959 | 11/1993 | Hayakawa | 372/45 |
| 5,289,484 | 2/1994 | Hayakawa | 372/45 |
| 5,413,956 | 5/1995 | Watanabe et al. | 438/29 |
| 5,724,462 | 3/1998 | Ido et al. | 385/14 |

*Primary Examiner*—Rodney Bovernick
*Assistant Examiner*—Quyen Phan Leung
*Attorney, Agent, or Firm*—Herbert M. Shapiro

[57] ABSTRACT

An InGaAsP/AlGaAs/GaAs heterostructure laser diode includes an InGaAsP quantum well and at least a cladding region of AlGaAs while essentially avoiding the deleterious effects attributed to the presence of Al in heterostructure laser diodes. Embodiments with Al present in the cladding region and with Al present in both the waveguide and the cladding regions are described.

4 Claims, 4 Drawing Sheets

INGAASP/ALGAAS/GAAS HETERO STRUCTURE DIODE LASER CONTAINING INDIUM

This invention relates to semiconductor diode lasers and, more particularly, to InGaAsP/AlGaAs/GaAs heterostructure lasers.

BACKGROUND OF THE INVENTION

AlGaAs/GaAs lasers have been manufactured commercially. But the lifetime of such lasers is limited severely by the presence of the AlGaAs material. The reason for the poor lifetime is attributed to the strong reactivity of aluminum (Al) with oxygen resulting in poor facet chemical stability and a decrease in the facet catastrophic optical damage limit. Also, the nearly equal size of Al and gallium (Ga) results in the easy generation and propagation of defects (dark lines defect and dark spot defects). The generation and propagation of dark line defect constitute a major failure mechanism for this type of laser. Consequently, the conventional wisdom dictates that Al be eliminated from laser structures.

GaInAsP/GaAs lasers have been developed to avoid the disadvantages attributed to the presence of Al. Such lasers have demonstrated far lower, long term degradation rates, higher power and the absence of sudden failure due to defect penning of Indium (In) atoms in GaInAsP. In lasers of this type GaInP is used as a cladding layer and large band gap GaInAsP is used as a waveguide material. But the band gap of GaInP is limited to 1.9 eV. Therefore, carrier leakage has been a major limiting factor. Also, GaInAsP used as the waveguide material, is nearly impossible to grade (linearly) in refractive index in order to achieve optimum wave guiding effects.

Since the limitations of the GaInAsP/GaAs structure could be overcome by the addition of Al, a contradiction results where Al is both to be eliminated and yet desired.

BRIEF DESCRIPTION OF THE INVENTION

In accordance with the principles of this invention, an InGaAsP/AlGaAs/GaAs heterostructure laser includes a quantum well comprising InGaAsP with a cladding of AlGaAs and, in a second embodiment, both waveguides and cladding regions of AlGaAs. The use of AlGaAs permits relatively high carrier confinement, easier growth control, and relatively low thermal resistance resulting in lower junction operating temperatures. The low power densities in the cladding region and in the waveguide regions reduces the problems associated with Al to negligible proportions in this material system.

DETAILED DESCRIPTION OF ILLUSTRATIVE EMBODIMENT OF THIS INVENTION

Figure 1:
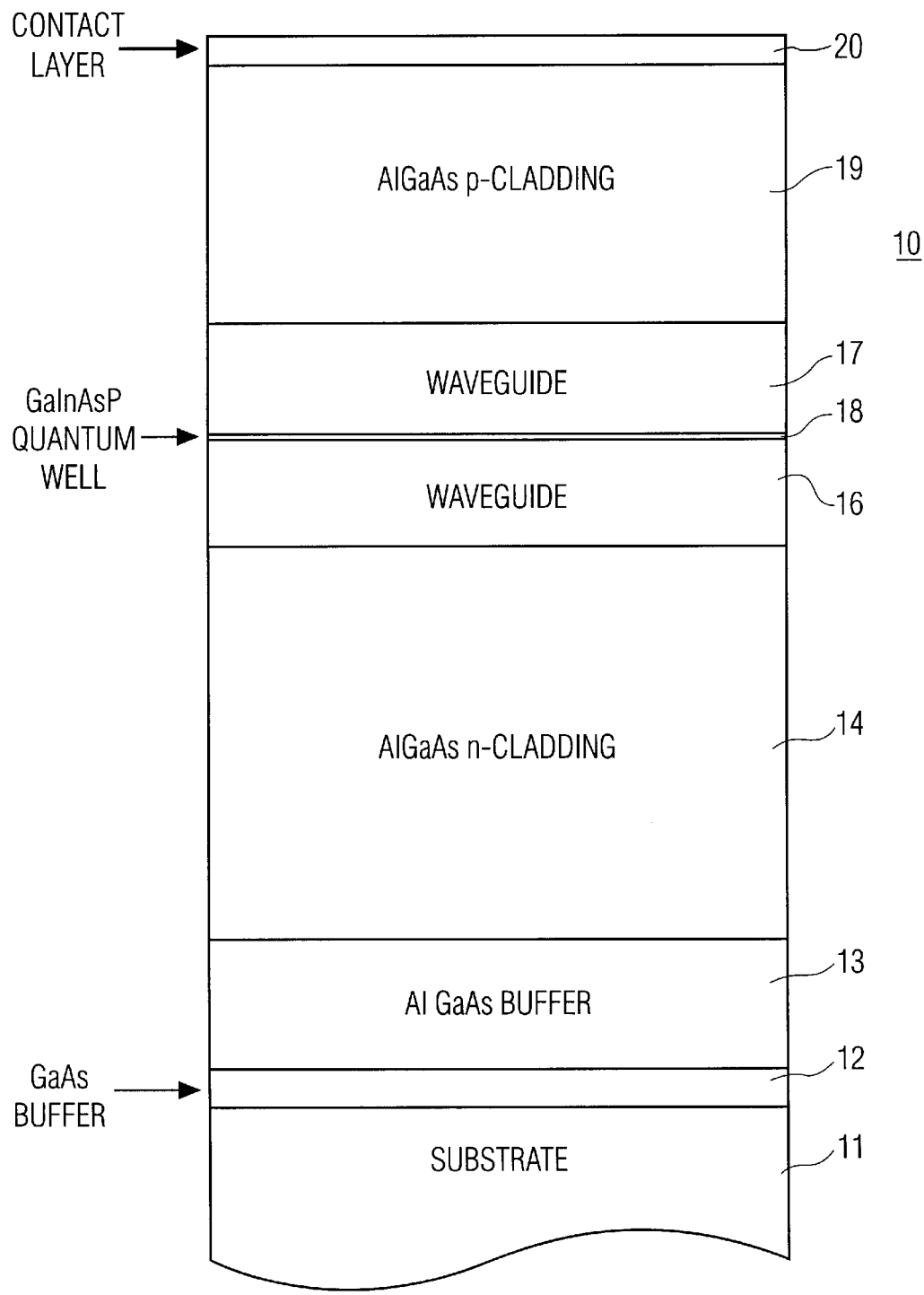
FIGS. 1, 3 and 5 are schematic side views of alternative embodiments of this invention.

FIG. 1 shows a heterostructure diode laser 10 in accordance with the principles of this invention. The structure includes a plurality of layers, typically formed by metal oxide chemical vapor deposition (MOCVD) processing, on a substrate 11. The substrate is a gallium arsenide (GaAs) crystal for purposes of the present invention.

A GaAs epitaxial layer 12 is grown on the surface of substrate 11 as is common. As aluminum gallium arsenide (AlGaAs) buffer layer 13 is grown on the GaAs buffer and on AlGaAs n-cladding 14 is grown on the AlGaAs buffer. Next, first and second waveguide layers 16 and 17 are formed with a gallium indium arsenic phosphorous quantum well 18 therebetween. Finally, an AlGaAs P-cladding 19 is formed with a contact layer 20 for electrical connection. The structure of the embodiment of FIG. 1 is characterized by the inclusion of aluminum in the cladding layers. There is no aluminum in the quantum well 18.

Figure 2:
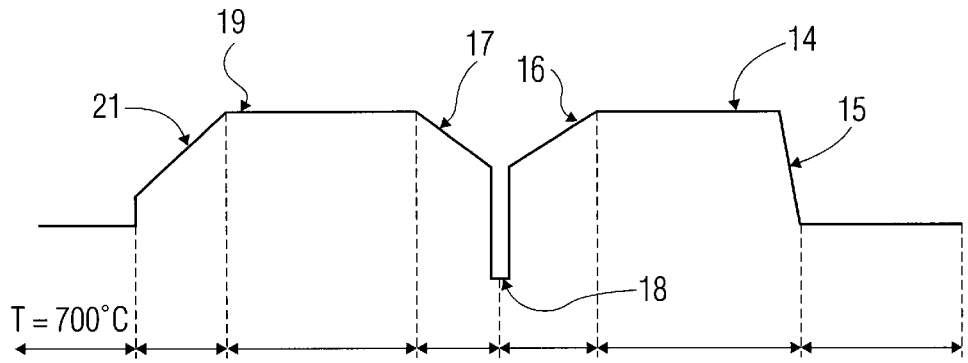
FIGS. 2, 4 and 6 are schematic profiles of the structures of FIGS. 1, 3 and 5.

FIG. 2 shows a typical profile of a quantum well laser diode but corresponding to the side view of a laser diode as represented in FIG. 1. The sloped areas 16 and 17 in FIG. 2 represent a linear change in the aluminum density from a higher density at the cladding layers 14 and 19 and a diminishing (to vanishing) density at the quantum well (18).

The structure of FIGS. 1 and 2 is grown starting with a GaAs, N-type doped to $2 \times 10^{18}/cm^3$. The substrate is heated to between 700–800° C. in $AsH_3$ for between 10 and 30 minutes to remove (normal) oxide and then maintained at between 650 and 700° C. for five minutes to grow epi GaAs buffer 12. The epi buffer layer (12) growth is continued for ten minutes to quench dislocations.

The aluminum concentration in cladding layer 19 is at about 60% and drops to about 14% and then to zero as shown in FIG. 2 and has a similar profile in region 17. The sloped area of cladding layer 19 in FIG. 2 is about 0.5 microns thick. The quantum well comprises GaInAsP and is grown (after layers 14 and 16) at a temperature (700° C.) which is gradually decreased to 600° C. for 40 seconds to incorporate indium into the band gap there.

Table I shows illustrative processing parameters for structures of the type shown in FIGS. 1 and 2, and the table shows the temperatures, processing time, percentage of aluminum, thickness and materials for each of the regions of the structures of FIGS. 1 and 2.

TABLE I

| Region | Range Temp | Time | % Al | Thickness | Material |
|---|---|---|---|---|---|
| 20 | 650 | 5 Min | 0 | 0.15 Micron | GaAs |
| 21 | 750 | 10 Min | Graded 10 to 60 | 0.4 Micron | AlGaAs |
| 19 | 720 | 30 Min | 60 | 1.5 Micron | AlGaAs |
| 17 | 720 | 5 Min | Graded 60 to 30 | 0.25 Micron | AlGaAs |
| 18 | 600 | 40 Sec | 0 | 100Å | GaInAsP |
| 16 | 720 | 5 Min | Graded 30 to 60 | 0.25 Micron | AlGaAs |
| 14 | 720 | 30 Min | 60 | 1.5 Micron | AlGaAs |
| 15 | 720 | 21 Min | Graded 60 to 10 | 0.1 Micron | AlGaAs |
| 11 | 650 | 3 Min | 0 | 0.1 Micron | GaAs |

In the embodiment of FIGS. 1 and 2, the concentration of Al in waveguide 16 and 17 varies linearly from a maximum at regions 14 and 19, respectively, to 30% at a distance from the quantum well. In another embodiment, the aluminum profile varies as a step function, aluminum being present only in one portion of the waveguide instance from the quantum well.

Figure 3:
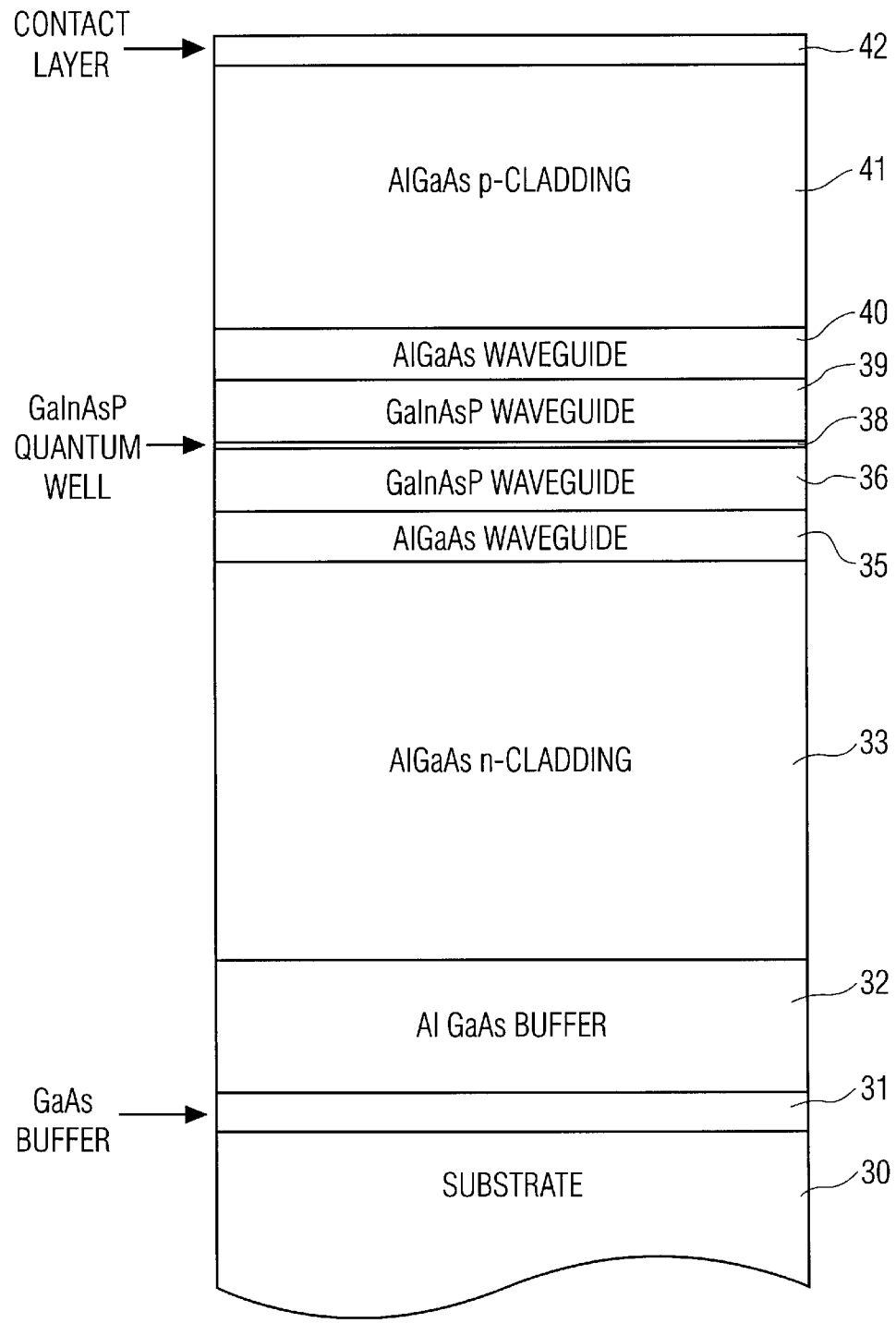

FIG. 3 is a schematic side view of such an embodiment. The structure includes a substrate of 30 of GaAs, a GaAs buffer 31, an AlGaAs buffer layer 32, an AlGaAs n-type cladding 33, an AlGaAs waveguide region 35, a GaInAsP waveguide region 36, a GaInAsP quantum well 38, a GaInAsP waveguide region 39, an AlGaAs waveguide region 40 and an AlGaAsp-type cladding 41. As in the embodiment of FIGS. 1 and 2, the structure includes an electrical contact layer 42.

Figure 4:
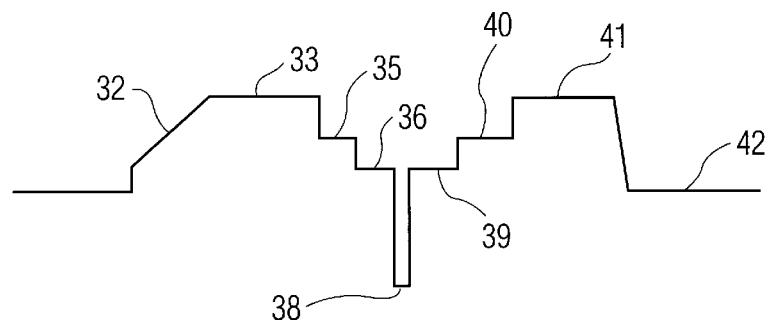

FIG. 4 shows a profile of the embodiment of FIG. 3. The profile is similar to that shown in FIG. 2 except for the step configuration of region 35–36 and 40–39. Table II shows the temperature, processing time, percent aluminum thickness and minerals of the various regions.

TABLE II

| Region | Range Temp | Time | % Al | Thickness | Material |
|---|---|---|---|---|---|
|  | 650 | 5 Min | 0 | 0.15 Micron | GaAs |
| 32 | 720 | 10 Min | Graded 10 to 60 | 0.4 Micron | AlGaAs |
| 33 | 720 | 30 Min | 60 | 1.5 Micron | AlGaAs |
| 35 | 720 | 4 Min | 30 | 0.1 Micron | AlGaAs |
| 36 | 600 | 4 Min | Bandgap~1.77 eve | 0.1 Micron | GaInAsP |
| 38 | 600 | 40 Sec | 0 | 100Å | GaInAsP |
| 39 | 600 | 4 Min | Bandgap~1.77 eV | 0.1 Micron | GaInAsP |
| 40 | 720 | 4 Min | 30 | 0.1 Min | AlGaAs |
| 41 | 720 | 30 Min | 60 | 1.5 Micron | AlGaAs |
|  | 720 | 2 Min | Graded 60 to 10 | 0.1 Micron | AlGaAs |
| 42 | 650 | 3 Min | 0 | 0.1 Micron | GaAs |

Figure 5:
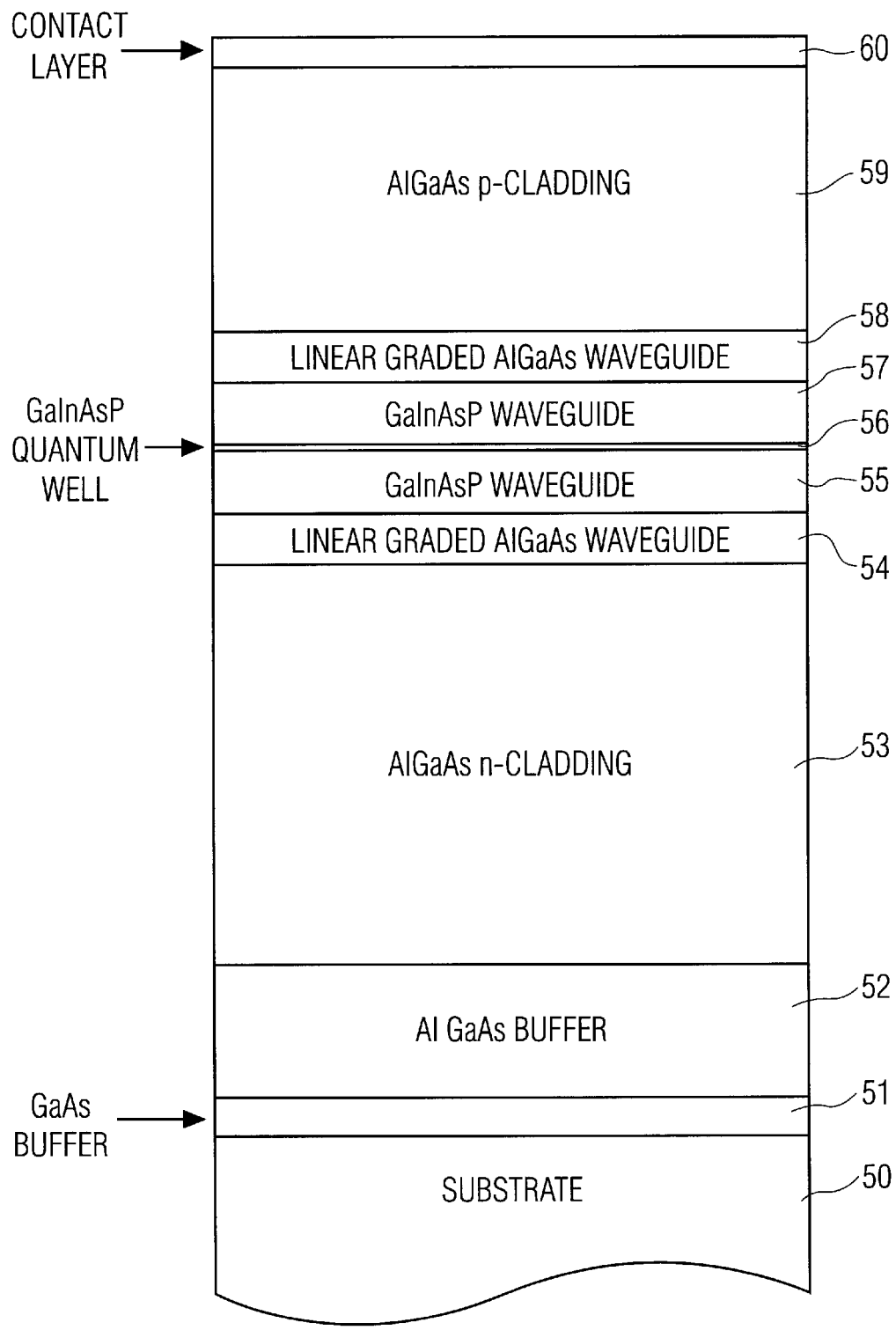

FIG. 5 shows an alternative embodiment of this invention where the waveguide region to each side of the quantum well includes two portions, the first, closer to the quantum well including Indium (In) and the second, further from the quantum well including a linearly graded composition of Al from a maximum at the adjacent cladding region to zero at the adjacent first portion.

Specifically, FIG. 5 shows a substrate 50 with an adjacent GaAs buffer region 51 and an AlGaAs buffer region 52. In AlGaAs N-type cladding region 53 is formed on the surface of region 51. Next, the linearly graded AlGaAs waveguide region 54 is formed followed by the GaInAsP waveguide region 55. GaInAsP quantum well region 56 is next, followed by a GaInAsP waveguide region 57 and the linearly graded AlGaAs waveguide region 58. AlGaAs p-type cladding region 59 abuts region 58 and the structure is completed with contact layer 60.

Figure 6:
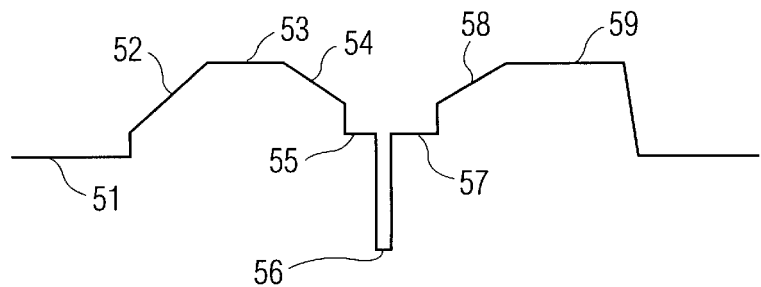

FIG. 6 shows the profile of the structure of FIG. 5 similar to that of FIG. 2 of FIG. 4. The aluminum concentration in the waveguide regions, in this embodiment is graded (regions 54 and 58) and zero close to the quantum well (regions 55 and 57). The processing details, thickness and materials are shown in Table III.

The hereinbefore problems associated with the presence of aluminum are absent in the structures of FIGS. 1–6 herein.

TABLE III

| Region | Range Temp | Time | % Al | Thickness | Material |
|---|---|---|---|---|---|
| 51 | 650 | 5 Min | 0 | 0.15 Micron | GaAs |
| 52 | 720 | 10 Min | Graded 10 to 60 | 0.4 Micron | AlGaAs |
| 53 | 720 | 30 Min | 60 | 1.5 Micron | AlGaAs |
| 54 | 720 | 4 Min | Graded 60 to 40 | 0.2 Micron | AlGaAs |
| 55 | 600 | 2 Min | 0 | 0.05 Micron | GaInAsP |
| 56 | 600 | 40 Sec | 0 | 100Å | GaInAsP |
| 57 | 600 | 2 Min | 0 | 0.05 Micron | GaInAsP |
| 58 | 720 | 4 Min | Graded 40 to 60 | 0.2 Micron | AlGaAs |
| 59 | 720 | 30 Min | 60 | 1.5 Micron | AlGaAs |
|  | 720 | 2 Min | Graded 60 to 10 | 0.1 Micron | AlGaAs |
|  | 650 | 3 Min | 0 | 0.1 Micron | GaAs |

What is claimed is:

1. A heterostructure InGaPAs/GaAs laser diode, said diode including a quantum well, said diode also including first and second waveguide regions to first and second sides of said quantum well, said diode also including first and second cladding regions coating said first and second waveguide regions respectively, each of said first and second waveguide regions comprising first and second portions adjacent to said quantum well and to the associated cladding region respectively, said second portion of each of said waveguide regions including a concentration of Al, said first portion thereof being free of Al.

2. A diode as in claim 1 wherein said quantum well includes In and said cladding regions include Al, said second portions of said waveguide regions including AlGaAs and a linearly graded concentration of Al from a maximum at the associated cladding region to zero at the associated first portion.

3. A diode as in claim 1 wherein said quantum well includes In and said cladding regions include Al, said second portions of said waveguide regions including a level concentration of Al and said first portions are free of Al.

4. A diode as in claim 1 wherein said Al concentration is graded from a maximum of about 60% to a minimum of about 12% and each of said cladding layers comprises AlxGa1-x As where the Al composition is greater than about 37%.

* * * * *